United States Patent
Degoirat et al.

(10) Patent No.: US 6,943,592 B2
(45) Date of Patent: *Sep. 13, 2005

(54) DETECTOR OF RANGE OF SUPPLY VOLTAGE IN AN INTEGRATED CIRCUIT

(75) Inventors: Hubert Degoirat, Nice (FR); Mathieu Lisart, Aix en Provence (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/858,231

(22) Filed: Jun. 1, 2004

(65) Prior Publication Data

US 2004/0222827 A1 Nov. 11, 2004

Related U.S. Application Data

(63) Continuation of application No. 10/034,969, filed on Dec. 21, 2001, now abandoned, which is a continuation of application No. 09/665,794, filed on Sep. 20, 2000, now abandoned, which is a continuation of application No. 08/876,282, filed on Jun. 12, 1997, now Pat. No. 6,147,521.

(30) Foreign Application Priority Data

Jun. 13, 1996 (FR) .............................. 96 07368

(51) Int. Cl.$^7$ .............................................. H03K 5/153
(52) U.S. Cl. ........................................ 327/77; 327/143
(58) Field of Search .............................. 327/65, 68, 74, 327/76, 77, 80, 81, 87, 143, 198, 205, 206

(56) References Cited

U.S. PATENT DOCUMENTS

| | | |
|---|---|---|
| 3,970,933 A | 7/1976 | Hamaguchi et al. |
| 4,044,304 A | 8/1977 | Hamaguchi et al. |
| 4,309,627 A | 1/1982 | Tabata |
| 4,367,423 A | 1/1983 | Hornung |
| 5,047,751 A | 9/1991 | Miura et al. |
| 5,214,316 A | 5/1993 | Nagai |
| 5,378,936 A | 1/1995 | Kokubo et al. |
| 5,440,254 A | 8/1995 | Sundby |
| 5,650,671 A | 7/1997 | Pascucci et al. |
| 5,781,648 A | 7/1998 | Sarpeshkar et al. |
| 5,859,803 A | 1/1999 | Nazarian et al. |
| 5,903,141 A | 5/1999 | Tailliet |
| 6,147,521 A | 11/2000 | Degoirat et al. |

FOREIGN PATENT DOCUMENTS

| | | |
|---|---|---|
| JP | 404 003 513 | 1/1992 |
| JP | 404 051 711 | 2/1992 |
| JP | 404 265 012 | 9/1992 |

*Primary Examiner*—Kenneth B. Wells
(74) *Attorney, Agent, or Firm*—Lisa K. Jorgenson; James H. Morris; Wolf, Greenfield & Sacks, P.C.

(57) ABSTRACT

The disclosure relates to detectors of the level of supply voltage in an integrated circuit. The disclosed detector is designed to detect the crossing of low levels of supply voltage. It comprises a first arm to define a first reference voltage and a second arm to define a second reference voltage, these two reference voltages varying differently as a function of the supply voltage and their curves of variation intersecting for a value of the supply voltage located close to a desired threshold. A comparator receives the two reference voltages. The first arm has a resistive divider bridge, an intermediate connector of which constitutes the first reference voltage. The second arm comprises a resistor series-connected with a native P type MOS transistor, the point of junction of this resistor and this transistor constituting the second reference voltage. A non-linear element may be parallel-connected to the resistor which constitutes the first reference voltage.

20 Claims, 7 Drawing Sheets

DETECTOR OF RANGE OF SUPPLY VOLTAGE IN AN INTEGRATED CIRCUIT

This application is a continuation of U.S. Ser. No. 10/034,969, filed on Dec. 21, 2001, now abandoned, which is a continuation of U.S. Ser. No. 09/665,794, filed on Sep. 20, 2000, now abandoned, which is a continuation of U.S. Ser. No. 08/876,282, filed on Jun. 12, 1997, now U.S. Pat. No. 6,147,521.

BACKGROUND OF THE INVENTION

1. Field of the Invention

The invention relates to detectors of the level of supply voltage Vcc of an integrated circuit.

These detectors are incorporated into the integrated circuit and can be useful for various applications such as:

- detecting that the supply voltage is in a specified range for which the circuit is designed and prohibiting operation if the voltage is in another range;
- detecting the range in which the supply voltage is located if there are several possible ranges, and changing the configuration of operation of the integrated circuit as a function of the detected range;
- ascertaining that the supply voltage has reached a specified threshold before permitting the operation of the integrated circuit.

Thus, for example, it may be sought to make a voltage level detector that finds out whether or not the voltage level is greater than about 2 volts and another detector that finds out whether or not it is greater than about 4 volts. These two detectors may be used simultaneously in one and the same integrated circuit which could work for several ranges of supply voltages that are different, such as for example a range of 2.7 to 3.3 volts and a range of 4.5 to 5.5 volts. The combination of information elements given by the two detectors indicates the range in which the supply voltage is located.

2. Description of the Prior Art

Figure 1:
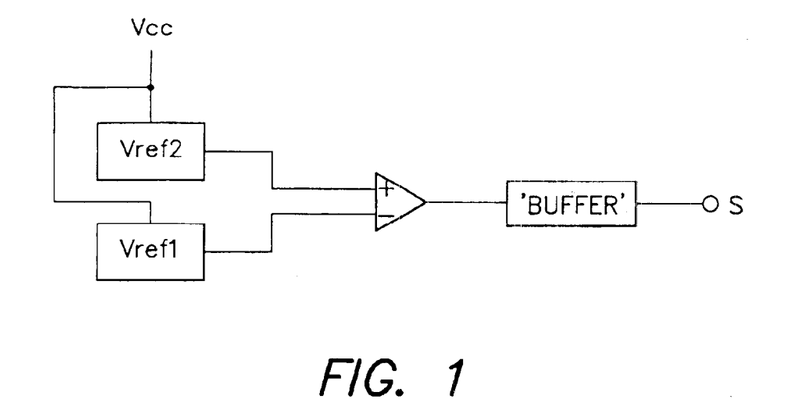
FIG. 1, already described, shows the general principle of a voltage supply level detector.
Figure 2:
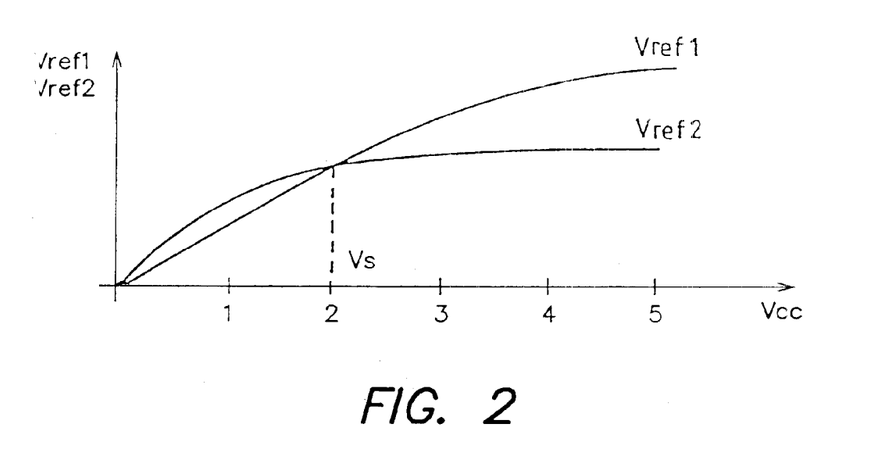
FIG. 2 shows the curves of variation of Vref1 and Vref2 as a function of Vcc, intersecting for a threshold voltage Vs to be detected.

Such a detector, shown in FIG. 1, consists of a comparator having as input two reference voltages, Vref1 and Vref2, that vary differently as a function of the supply voltage, VCC, and that vary in such a way that their curves of variation intersect when the supply voltage reaches a specified threshold (FIG. 2). The comparator compares these two references and switches over in one direction or another depending on whether the supply voltage Vcc crosses this threshold or not. The output of the comparator may be applied through a buffer amplifier to the rest of the integrated circuit in order to modify, permit or prohibit its operation depending on the desired application.

There are two main difficulties, which affect the detection of low supply voltage levels (the detection of a threshold of 2.5 volts for example). First, it is difficult to make a comparator that works accurately even when it is supplied with a low value of supply voltage (far below the threshold to be detected). Second, it is difficult to make reference voltages that meet the above conditions (regarding different variations as a function of Vcc, and threshold value of intersection of their variation curves) because each reference voltage varies as a function of Vcc which depends firstly on the operating temperature of the integrated circuit and secondly on the variations of parameters of the method of manufacture of this circuit.

Consequently, whereas it is sought to have reference voltages whose curves of variation intersect at a well-defined point that corresponds to a desired threshold value Vs, it is observed in reality that it is necessary to plot a quadruple network of curves that intersect in a zone of threshold values which may be very extensive. This quadruple network consists of two networks of curves for the first reference voltage Vref1 and two networks for the second reference Vref2. For each reference, a network of curves may be plotted as a function of the possible variations of the manufacturing method and another may be plotted as a function of the operating temperature of the circuit.

It can be easily understood that, with this quadruple network, the variation of the threshold voltage as a function of manufacture and as a function of the temperature becomes great and makes the detector of little use and of little reliability.

This is all the truer as the curves of variation of the reference voltages intersect with a narrower acute angle. For, the greater the manufacturing and temperature variations, the more variable will be the position of the intersection.

Figure 3:
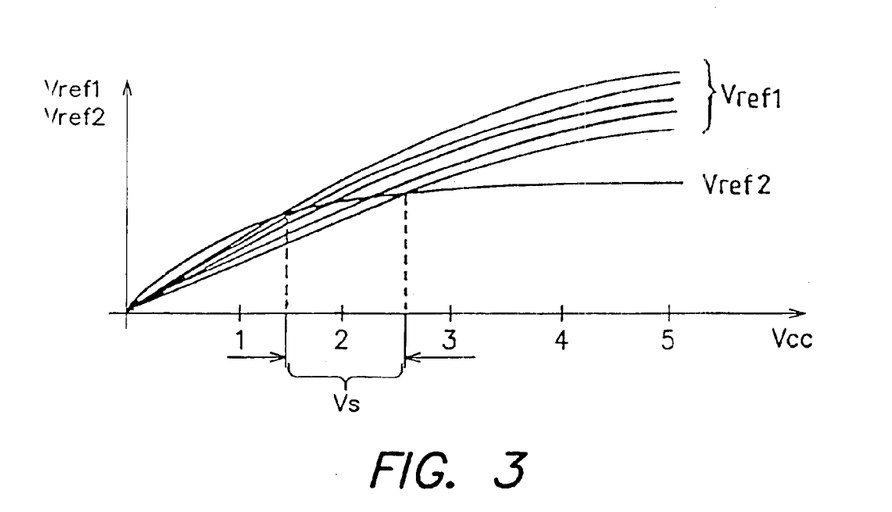
FIG. 3 shows the variation of the threshold voltage detected.

FIG. 3 gives an exemplary illustration of the different points of intersection of a curve Vref2 with several curves Vref1 corresponding to a certain degree of variation of manufacturing parameters and/or a variation of operating temperature. The result thereof is uncertainty in regard to the significance of the output information from the comparator for it corresponds to a crossing of a threshold Vs which may vary within a fairly broad range.

There is therefore need for a detector whose detection threshold is as stable as possible despite variations in manufacture and despite variations in operating temperature. This detector must be simple and must consume little current.

SUMMARY OF THE INVENTION

The invention proposes a detector of this kind to detect the level of supply voltage Vcc of an integrated circuit, this detector comprising a first arm to define a first reference voltage Vref1 and a second arm to define a second reference voltage Vref2, these two reference voltages varying differently as a function of the supply voltage Vcc and their curves of variation intersecting for a value of Vcc located close to a desired threshold Vs, and a comparator receiving the two reference voltages, wherein the first arm has a resistive divider bridge, of which an intermediate connector constitutes the first reference voltage Vref1 and the second arm comprises a resistor series-connected with a native P type MOS transistor, the point of junction of this resistor and this transistor constituting the second reference voltage.

It may be recalled that a native transistor, as opposed to a depleted or enhanced transistor, is a transistor formed in a doped semiconductor region, the channel of which has not undergone any surface depletion (P type doping for a PMOS transistor) or surface enhancement (N type doping for a PMOS transistor). The channel is therefore formed directly on the surface of the doped region without the performance of an ion implantation or diffusion after the formation of the well. In the present case, the native transistor is a P type transistor and it is generally formed in an N type well diffused in a P type substrate. The use of such a native transistor in the arm that defines the voltage Vref2, in combination with the use of a resistive divider bridge in the arm that defines Vref1, leads to high stability of the threshold value Vs of supply voltage Vcc that is to be detected. One of the reasons for this stability is the fact that the absence of doping of the channel eliminates a factor of variation of characteristics in the manufacturing method. Furthermore, the use of a resistive divider bridge, alone or complemented by a non-linear element, enables the very efficient control, by a simple choice of relative values of resistance, of the zone of intersection of the curves of Vref1 and Vref2 as a function of Vcc.

The native P type transistor is, in principle, mounted as a diode, namely with its gate connected to its drain. The gate and the drain are then connected to the ground, while the resistor series-connected with the transistor is connected between the source of the transistor and the supply Vcc.

In a particularly useful embodiment for making a detector with a low threshold level (about 2.5 volts), a non-linear element with low conduction threshold voltage is connected in parallel to a resistor of the divider bridge (in practice the non-linear element is connected in parallel to the resistor at the terminals of which the voltage Vref1 is taken). The non-linear element is chosen so that the variation of Vref1 as a function of the temperature compensates for the variation of Vref2 as a function of the temperature, so that the curves Vref1 and Vref2 intersect for a value of supply voltage substantially independent of the temperature.

The non-linear element is preferably a series-connected assembly of a PMOS transistor and an NMOS transistor (preferably native) mounted as a diode. The sum of their threshold voltages is preferably lower than the threshold voltage of the native P type transistor.

BRIEF DESCRIPTION OF THE DRAWINGS

Other characteristics and advantages of the invention shall appear from the following detailed description, made with reference to the appended drawings, of which.

DETAILED DESCRIPTION

Figure 4:
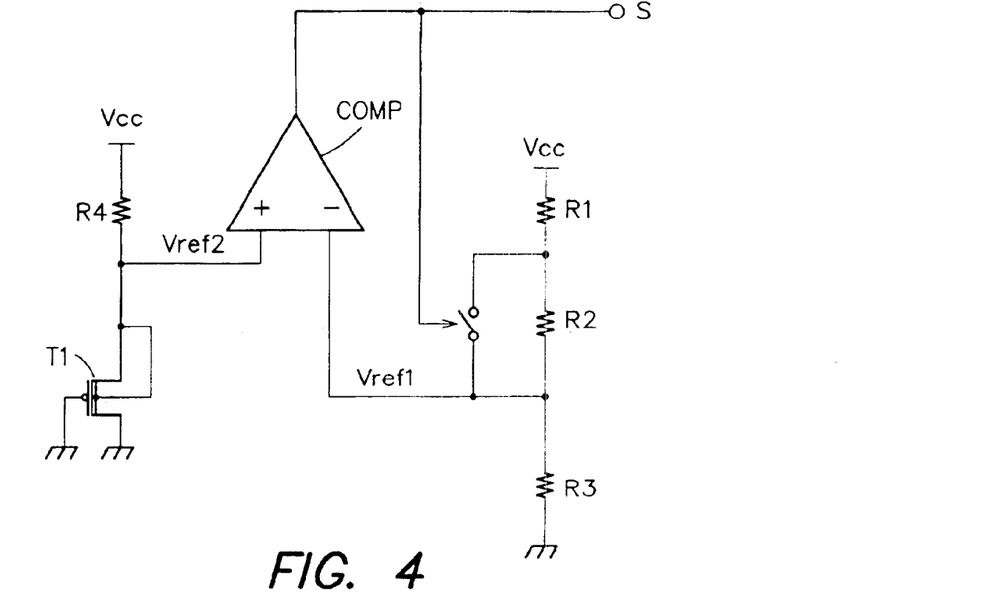
FIG. 4 shows a diagram of a detector according to the invention.

The general schematic drawing of the invention is shown in FIG. 4. The detector has two arms supplied with the voltage Vcc, one used to define a reference voltage Vref1 having a first type of variation as a function of Vcc and the other used to define a reference voltage Vref2 having a second type of variation as a function of Vcc. The two types of variation are different in order that the curves of variation may intersect. The first arm has a divider bridge of resistors (R1, R2, R3) while the second arm has a resistor (R4) series-connected with a native P channel transistor T1. An intermediate connector of the divider bridge of the first arm defines the reference Vref1. The point of junction of the resistor and the transistor of the second arm defines the reference Vref2. These two reference voltages are applied to the inputs of a comparator COMP which gives a logic signal at an output S. The signal at the output S has a first level (for example a high level) when Vref2 is greater than Vref1, which occurs if Vcc is below a threshold Vs. If not, it has a second level (low level).

In the embodiment described in FIG. 4, designed to detect any passage of the supply voltage beyond a threshold of about 4 volts, the native transistor P has its gate connected to the ground, its source connected to the resistor R4 and its drain connected to the ground. The source is connected to the well in which, in a standard way, there is formed the transistor (integrated circuit on P type substrate, N type well for the P channel transistors, and this well does not undergo any surface implantation of depletion or enhancement).

The divider bridge here is formed by three series-connected resistors, R1 connected to Vcc, R3 connected to the ground and R2 connected between R1 and R3. The intermediate connector defining Vref1 is the junction point of R2 and R3. The resistor R2 may be short-circuited by a switch activated by the output of the comparator. It is used to set up hysteresis in changing the value of the division ratio set up by the divider bridge depending on whether the comparator switches over in one direction or the other. Here, when Vcc is below the threshold Vs, the resistor R2 is short-circuited, the division ratio is R3/(R1+R3). If Vcc goes beyond the threshold (which depends on this division ratio), the comparator switches over and sets up the series connection of the resistor R2, making the division ratio go to R3/(R1+R2+R3). This tends to lower the threshold Vs for which the comparator switches over. Thus, the instabilities when the voltage Vcc is close to the threshold are avoided.

The sum R1+R2+R3 is any sum that is low enough so as to avoid excess consumption of current, for current consumption is a major factor to be watched in the designing of an integrated circuit.

Owing to the fact that Vref1 is set up, in this embodiment, only by the divider bridge to whose terminals the supply voltage Vcc is applied, the reference voltage Vref1 varies linearly as a function of Vcc. The slope of this variation is R3/(R1+R3) or R3/(R1+R2+R3). Such a slope depends very little on the method of manufacture for it does not depend on the value of the resistors (which are subject to high variations of manufacture) but only on their ratio (which undergoes very small variations).

The ratio R3/(R1+R3) is chosen so as to set up a slope of variation of Vref1 as a function of Vcc which intersects the curve of variation of Vref2 for a value of Vcc equal to a desired threshold Vs, which in this case is in the range of. 4 volts. The slope to be chosen for the curve Vref1 as a function of Vcc to obtain this threshold depends of course on the curve of variation of Vref2 and this curve depends on the resistor R4 and the transistor T1. By a process of empirical definition, it is possible to find values of R1, R3 and R4 that are appropriate for obtaining a given threshold.

The transistor T1 has a threshold voltage Vtp0 of the order of 1.6 volts. So long as. Vcc remains below this value, the transistor remains off and the voltage Vref2 remains at the same value as Vcc. As Vcc increases, the transistor gradually becomes conductive and the current in the resistor R4 increases essentially linearly with Vcc such that the voltage Vref2 increases substantially logarithmically with Vcc.

The logarithmic curve obtained depends on the value of R4 and the geometrical dimension (channel width/length ratio W/L) of the transistor.

Figure 5:
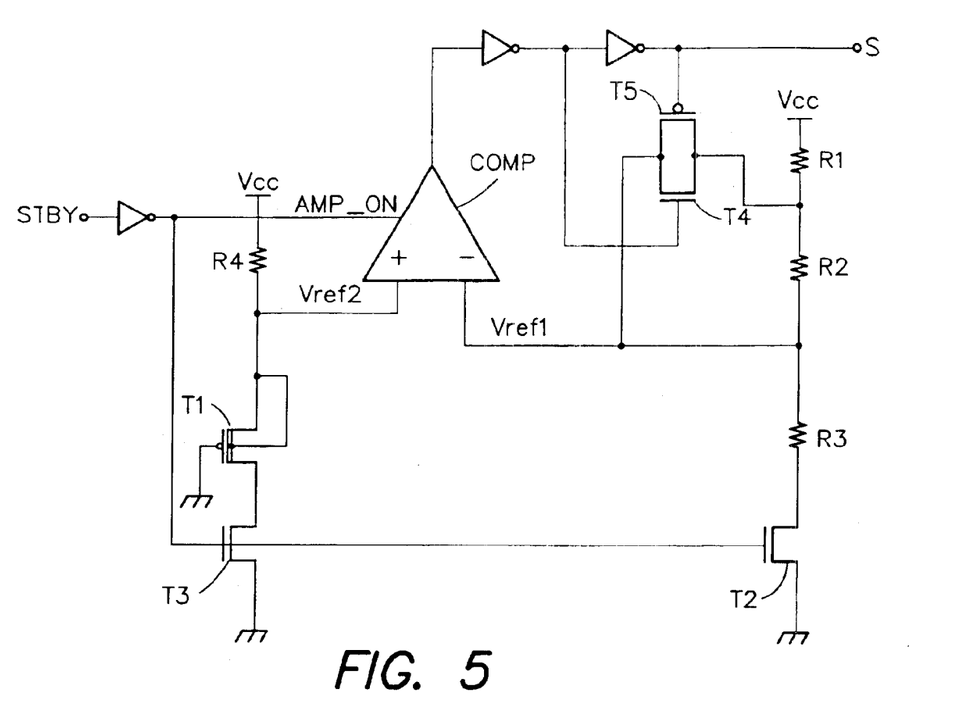
FIG. 5 shows a more detailed diagram.

In practice, the detector shown schematically in FIG. 4 may have other accessory elements. By way of an example, FIG. 5 shows a practical embodiment in which there has been added a circuit designed to prevent the consumption of current when the integrated circuit is in a state of standby. An input terminal STBY transmits a standby signal which, when it is at the high logic level, interrupts the consumption of current in the two arms of the detector by means of the transistors T2 and T3 and inhibits the consumption of current and the working of the comparator COMP (by cancelling the signal for authorizing operation AMP_ON). The transistor T3 is inserted between the transistor T1 and the ground, and the transistor T2 is inserted between the resistor R3 and the ground. Their influence on the working of the detector is negligible.

The switch which short-circuits the resistor R2 for the hysteresis may be formed in a standard way by an N type transistor T4 parallel-connected with a P type transistor T5, one of these transistors being controlled by the same logic level as that coming out of the comparator and the other being controlled by the complementary logic level. In an exemplary embodiment for which curves of variation of Vref1 and Vref2 have been plotted in FIG. 6, the following values have been chosen for the resistors and the transistor T1, with a view to obtaining a threshold voltage of about 4 volts: R1=52 kiloohms, R2=5 kiloohms, R3=200 kiloohms, R4=57 kiloohms and W/L=4.5/5.7 (micrometers) for T1.

Figure 6:
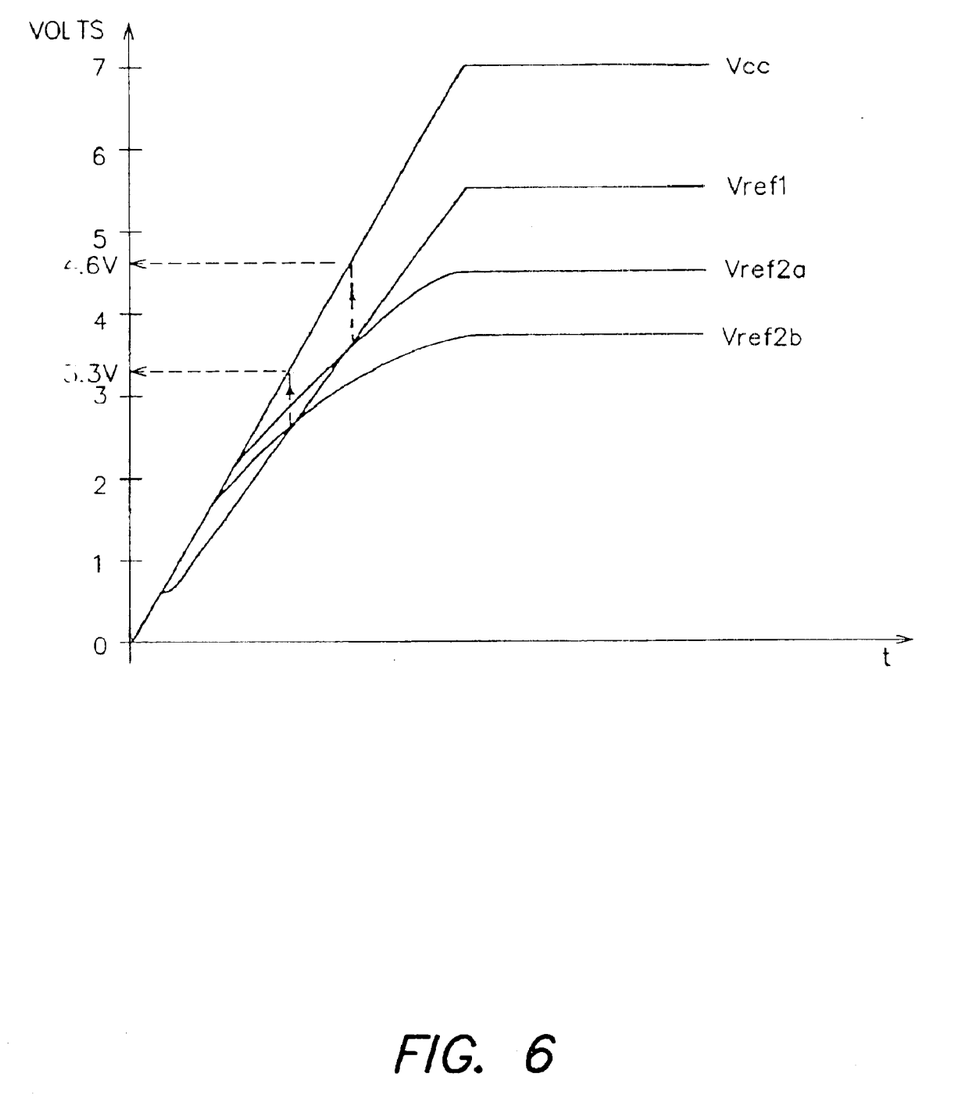
FIG. 6 shows the curves of variation of Vref1 and Vref2 as a function of time when a linearly increasing and then stable voltage Vcc is applied.

The curves plotted in FIG. 6 show the variations of Vref1 and Vref2 as a function of time while Vcc varies linearly as a function of time and stabilizes at a value of 7 volts. This indirectly amounts to a depiction of Vref1 and Vref2 as a function of Vcc.

Since Vref1 in practice does not at all depend on the parameters of the method of manufacture or the operating temperature of the integrated circuit, a single curve Vref1 has been plotted. However, since Vref2 depends on the variation of the parameters of the method of manufacture and also depends on the operating temperature, two extreme curves Vref2a and Vref2b have been plotted, representing the maximum variation of the curve Vref2.

The intersection of the curve Vref1 and of the curve Vref2a corresponds to a first value of Vcc substantially equal to 4.6 volts. The intersection of Vref1 and Vref2b corresponds to a second value of Vcc, substantially equal to 3.3 volts.

Consequently, the comparator switches over and the detector gives a logic signal pertaining to a crossing of a threshold when Vcc exceeds 4 volts, but with a margin of error of about 0.6 volts due to the variations of manufacture and due to the temperature.

This margin of error is acceptable in an application where it is sought to find out if the supply voltage is rather in the 2.7-to-3.3 volt range or rather in the 4.5-to-5.5 volt range.

With this same principle, but with a slightly modified embodiment, it is possible to detect a far lower threshold of supply voltage, substantially equal to 2 volts for example, with a smaller margin of error.

To detect a supply voltage of approximately 2 volts, the value of the resistor R4 and the size of the transistor T1 are increased to achieve an overall reduction of the voltage Vref2 which stabilizes swiftly in the neighborhood of the threshold voltage of the transistor T1 (about 1.6 volts). This results in a curve Vref2a and a curve Vref2b which can be seen in FIG. 8 pertaining to a case where the resistor R4 is equal to 500 kiloohms and the geometry of the transistor is W/L=20/2 micrometers. The variation of the curve Vref2 comes above all from the operating temperature of the integrated circuit.

Figure 8:
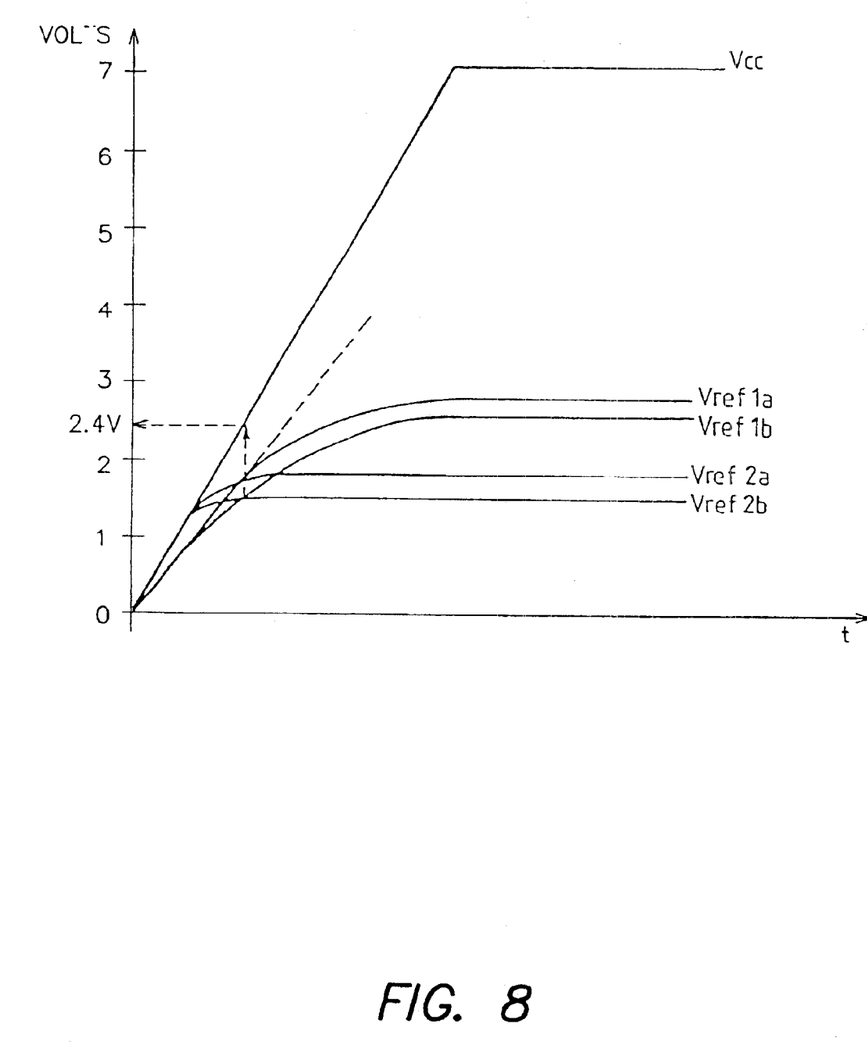
FIG. 8 shows the corresponding curves of variation for Vref1 and Vref2.

The intersection of the curves Vref2a and Vref2b with a single straight line Vref1 as in FIG. 6 gives varied threshold values as explained above, both for a detector of a threshold of about 4 volts and for the detector of a threshold of about 2.5 volts.

Figure 7:
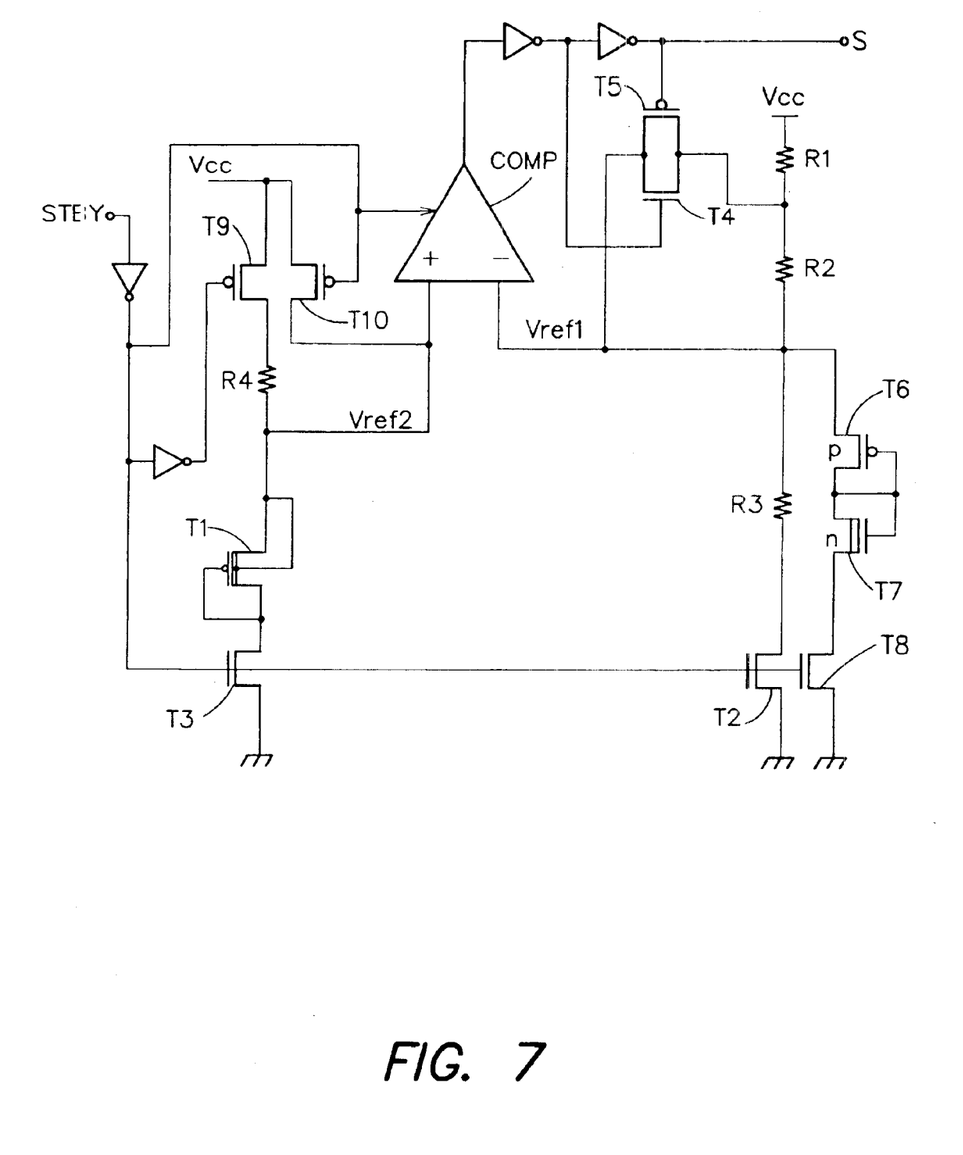
FIG. 7 shows a variant of an embodiment for the detection of a threshold of about 2.5 volts.

However, this threshold variation can be reduced by adopting an additional measurement, used in FIG. 7, consisting of the parallel connection, to the resistor R3, of a non-linear element that plays no role so long as Vcc is low enough, but then attenuates the slope of the straight line Vref1 in a non-linear way. This attenuation must depend on the parameters of the method of manufacture as well as on the operating temperature of the integrated circuit, somewhat in the same way as the dependence of Vref2, so as to restrict the effective zone of intersection of the curves Vref1 and Vref2.

In examining FIG. 8, it can be seen that a curve Vref1a has been plotted, representing a limit of variation of Vref1 as a function of the manufacturing parameters. This curve intersects the corresponding curve Vref2a (for the same extreme parameters of manufacture) at a point corresponding to Vcc=2.4 volts. And the curve Vref1b intersects the curve Vref2b (for the other extreme of manufacturing parameters,) at another point corresponding almost exactly to the same value 2.4 volts for Vcc.

Consequently, it will be understood that the range of error on the threshold can be reduced to a very large extent, while at the same time enabling an easy choice of the value of this threshold.

In the embodiment shown in FIG. 7, with reference to a 2.5 volt detector, the non-linear element parallel-connected to the resistor R3 is a series-connected assembly of two transistors mounted as a diode (with the gate connected to the drain), one being a P channel transistor T6 and the other being a native N channel transistor T7. These transistors may be series-connected with a transistor T8 controlled like the transistors T2 and T3 so as to be off in the standby mode. The sum of the threshold voltages of the transistors T6 and T7 is smaller than the threshold voltage of the transistor T1, so that the straight line Vref1 with a slope R3/(R3+R1) as a function of Vcc becomes curved (by the gradual placing of T6 and T7 in a state of conduction) in the region of intersection of the curves Vref1 and Vref2, namely for a value of Vref2 similar to the threshold voltage of T1 (1.6 volts in the example given). For example, where the sum of the threshold voltages T6 and T7 is about 1 volt to 1.3 volts (with a high dependence depending on the temperature of the circuit), the dependence of Vref1 on the temperature is fairly similar to the temperature dependence of Vref2.

Two additional transistors T9 and T10, activated by the standby signal STBY, have been designed to place Vref2 initially at Vcc, in order to ensure, unambiguously, that the operation of the circuit will start in a condition where Vref2 is greater than Vref1.

One example of the numerical values that may be used to make a level, detector of about 2.5 volts, leading to the curves shown in FIG. 8, is given here below:

R1=80 kiloohms, R2=20 kiloohms, R3=450 kiloohms
R4=500 kiloohms,
geometry of T1: W/L=20/2
geometry of T6: W/L=15/2.4
geometry of T7: W/L=5/2.4.

Figure 9:
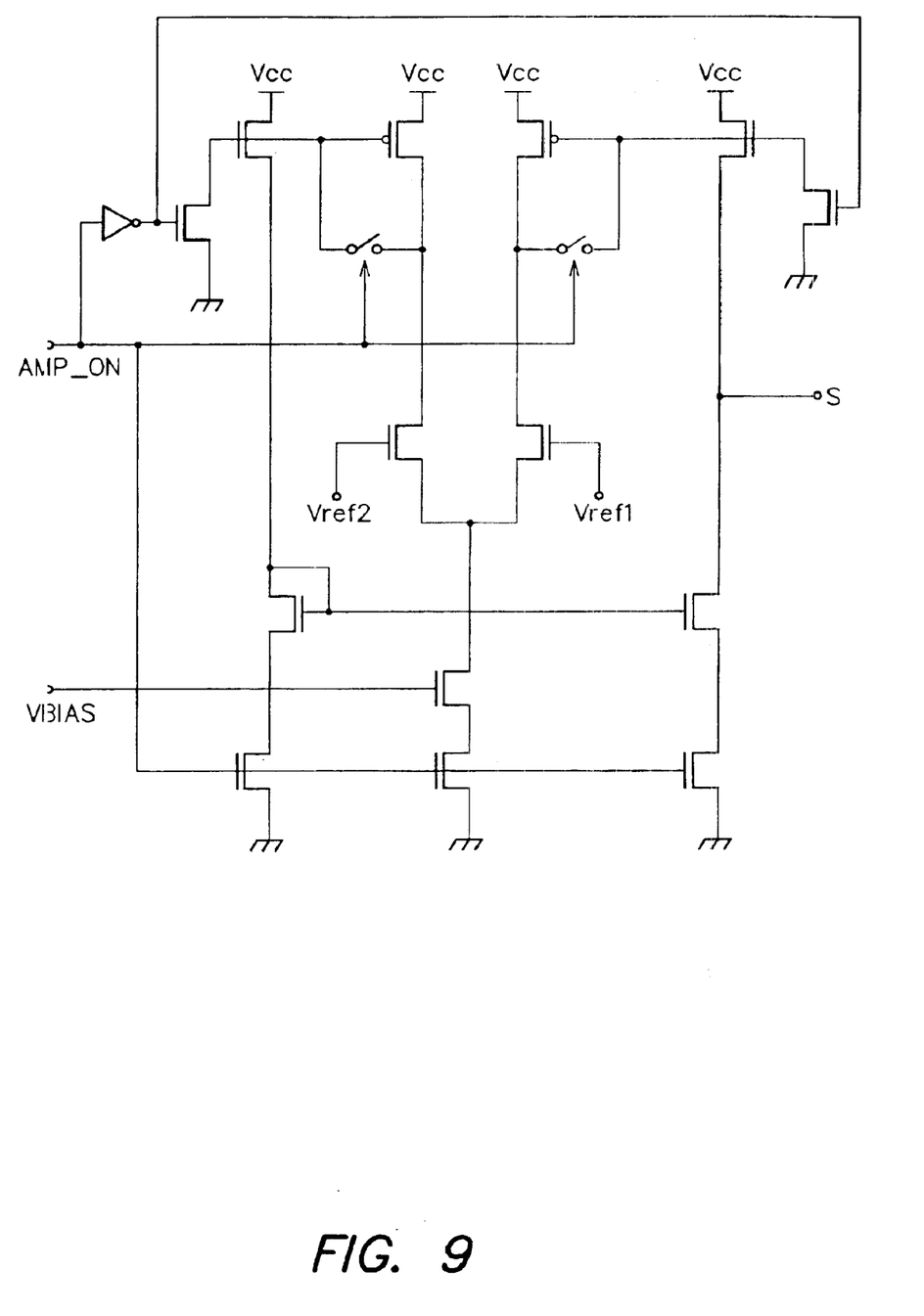
FIG. 9 shows a diagram of a comparator that can be used in the detector according to the invention.

FIG. 9 shows an example of a diagram of a comparator that can be used in the circuits of these above figures. This comparator can work even for very low supply voltages of less than 2 volts. This comparator is put into operation only outside standby periods, by means of a signal AMP_ON (the logic complement of the standby setting signal STBY). The signal AMP_ON permits or prohibits the passage of current in the different arms of the comparator.

The integrated circuit may simultaneously include a detector such as the one shown in FIG. 5 for the detection of a four-volt threshold and a detector such as that of FIG. 7 for the detection of a 2.5-volt threshold. The logic combination of the output indications from these two detectors enables, for example, the very simple determination of the range of supply voltages in which Vcc is located, when it is known in advance that the possible ranges are the following:

below 2.5 volts, in the nominal range of 2.7 to 3.3 volts, in the nominal range of 4.5 to 5.5 volts.

Figure 10:
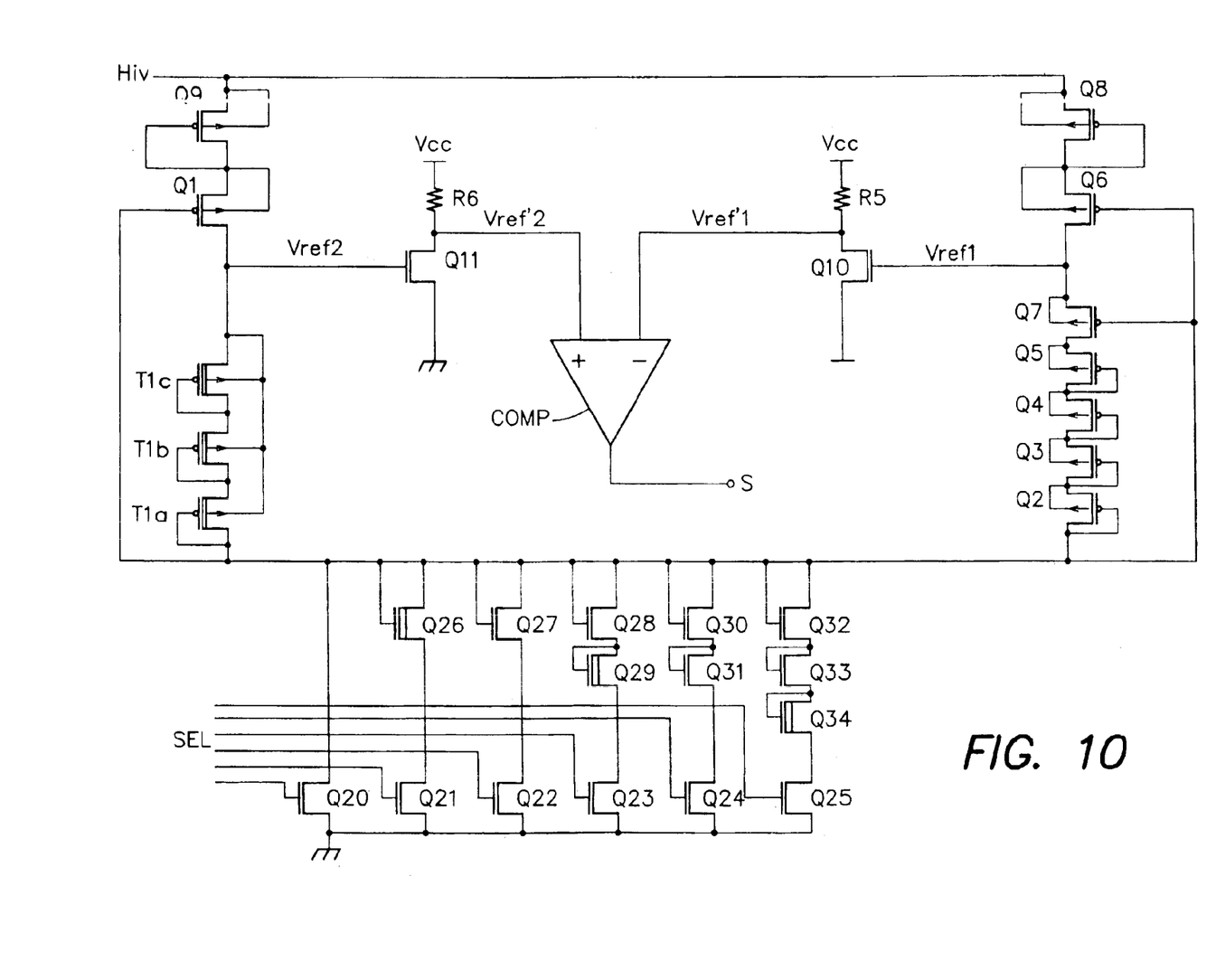
FIG. 10 shows a more complex embodiment of the invention, designed to detect higher voltage supply levels.

In a more complex embodiment, shown in FIG. 10, different improvements are provided. These improvements can be used separately or together, and seek above all to adapt the circuit to the detection of higher supply voltage levels.

In particular, in integrated circuits comprising electrically programmable non-programmable memories, there is need for supply voltages in the range of 15 or 18 volts for the write circuits of the memory. These supply voltages are not given directly from the exterior of the integrated circuit but are generally given by a so-called <<load pump>> circuit, present in the integrated circuit itself and operating through the one and only supply Vcc of the integrated circuit. It may be necessary to detect the level of the high supply voltage Hiv given by the load pump.

The circuit of FIG. 10 enables this detection to be made. It has different parts, some of which receive the voltage Hiv to be detected while others are supplied with the ordinary voltage Vcc (3 volts or 5 volts for example).

The modifications of the circuit with respect to the schematic drawing of FIG. 4 are as follows: first of all, the two arms used to define the voltage references Vref1 and Vref2 are joined by a common conductor, constituting a base for the two arms, this common conductor representing a fictitious ground MF for which it will be seen that its potential may be carried to the true ground of the circuit or to a higher potential that may be chosen at will.

The resistors R1, R3 of the divider bridge of the first arm are made in the form of two P channel transistors Q6, Q7 whose gates are connected to the fictitious ground. The point of junction between these two transistors is the one that defines the reference voltage Vref1. A series of diode-mounted transistors (with the drain connected to the source), in this case a series constituted by P channel transistors Q2, Q3, Q4, Q5, is interposed in the first arm, between the fictitious ground and the resistive divider bridge Q6, Q7. These transistors Q2 to Q5 are used to set up a desired voltage drop between the fictitious ground and the resistive divider bridge. Their presence and their number depends on the application that is specifically envisaged.

Furthermore, it has been planned that there will be several P channel native transistors T1a, T1b, T1c series-connected in the first arm and not just one native transistor T1.

In the second arm, the resistor R4 of the circuit of FIG. 4 is formed by a P channel transistor Q1 whose gate is connected to the fictitious ground.

To obtain a drop in potential between the level of the supply voltage Hiv and the junction point that defines the first reference voltage Vref1 (the junction between the source of Q6 and the drain of Q7 in the diagram of FIG. 10), there is provided, in the first arm, between this point and the supply voltage Hiv, an element capable of causing a drop in potential, preferably a P channel transistor Q8 having its gate connected to its drain and having high internal resistance (for example, with a length 50 times greater than its width). The drop in voltage may thus have a value of several volts. The transistor Q8 may be located between the transistor Q6 and the supply Hiv or between the transistor Q6 and the junction point that defines the reference Vref1.

A similar arrangement may be adopted in the second arm, with a transistor Q9 that brings about a drop of several volts in the voltage between the supply Hiv and the junction point that defines the second reference Vref2. The transistor Q9 may be located between the transistor Q1 and the voltage Hiv or between the transistor Q1 and the reference Vref2.

With this type of arrangement, the reference voltages Vref1 and Vref2 may be in the range of 7 to 8 volts. These voltage are however far too high to enable an operation of the comparator COMP. For, this comparator COMP is powered at a voltage Vcc of about 3 to 5 volts.

It is therefore preferably provided that the voltage Vref1 and the voltage Vref2 will be converted, by stages of transposition of voltage level, into two other auxiliary reference voltages Vref'1 and Vref'2, of a lower level (about 1.5 volts), and it is these auxiliary references that are effectively applied to the inputs of the comparator COMP.

For this purpose, the voltage Vref1 is applied to the gate of a highly resistive N channel transistor Q10, whose source is at the electrical ground (and not at the fictitious ground MF) and whose drain is connected by a resistor R5 to the low supply voltage Vcc. The auxiliary reference voltage Vref'2 is taken at the junction of the transistor Q10 and the resistor R5.

Similarly, the voltage Vref2 is applied to the gate of a highly resistive N channel transistor Q11, whose source is at the electrical ground and whose drain is connected by a resistor R6 to the low supply voltage Vcc. The auxiliary reference voltage Vref'2 is taken at the junction of the transistor Q10 and the resistor. R5.

Finally, to enable, if desired, an adaptation of the detector to the various ranges of possible values of voltage levels to be detected, it is provided that the potential of the fictitious ground MF may be offset with respect to the ground of the integrated circuit, through a set of arms that can selectively connect the fictitious ground to the ground under the control of a selection circuit. The different arms set up different voltage drops when they are put into operation. A selected arm will be put into operation by the operation of turning on a transistor located at the foot of this arm (transistors Q20 to Q25 in the diagram of FIG. 10 which has six possible arms). A selection signal SEL activates the operation of turning on a selected arm (in principle only one arm at a time).

The different voltage drops are set up by different transistors mounted in these arms (it is assumed that the base transistor introduces no voltage drop or a very low and identical voltage drop in all the arms). In the example shown, designed for the precise adjustment of the voltage level detected, there are provided six arms in which the voltage drops introduced are due to one or more series-connected N channel transistors that are diode-mounted. These arms are the following:

arm A: direct link to place the fictitious ground MF at the real ground;

arm B: drop in voltage of a native transistor Q26;

arm C: drop in voltage of an enhanced transistor Q27;

arm D: drop in voltage of an enhanced transistor Q28 series-connected with a native transistor Q29;

arm E: drop in voltage of two enhanced transistors Q30 and Q31;

arm F: drop in voltage of two enhanced transistors Q32 and Q33 and one native transistor Q34 or two native transistors and one enhanced transistor;

and so on and so forth, other arms could be planned, with the parallel connection of several arms itself possibly providing for greater precision of adjustment of the levels to be detected.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A detector of the level of supply voltage of an integrated circuit, comprising:
    a comparator having a first input receiving a first reference voltage and a second input receiving a second reference voltage, the two reference voltages varying differently as a function of a supply voltage to form curves of variation which intersect at a value of supply voltage which is located close to a desired threshold, the comparator further having an output which switches from a first state to a second state when the supply voltage crosses the threshold;
    a resistive divider bridge supplied with the supply voltage, having an intermediate connector of which constitutes the first reference voltage; and
    a resistor series-connected with a native P type MOS transistor, supplied with the supply voltage, a point of junction of the resistor and the transistor constituting the second reference voltage;
    wherein a non-linear element with relatively low conduction threshold voltage is parallel-connected to a resistor of the divider bridge.

2. A detector according to claim 1, wherein the native P type transistor has a gate, source and drain, where the gate is connected to the drain.

3. A detector according to claim 2, wherein the gate and the drain are connected to the ground and the resistor which is series-connected with the transistor is connected between the source of the transistor and the supply voltage.

4. A detector according to claim 1, wherein the non-linear element is
    parallel-connected to the resistor of the divider bridge at the terminals of which the first reference voltage is taken.

5. A detector according to claim 4, wherein the non-linear element has conduction threshold characteristics that vary as a function of the temperature in such a way that the curve of variation of the first reference voltage has substantially similar temperature dependency as the curve of variation of the second reference voltage such that the first and second curves intersect at a value which is substantially independent of the temperature.

6. A detector according to claim 1, wherein the p type native transistor has a first conduction threshold voltage and wherein the non-linear element has a second conduction threshold voltage lower than the first conduction threshold voltage.

7. A detector according to claim 1, wherein the non-linear element comprises a series assembly of an N channel transistor and a P channel transistor.

8. A detector according to claim 7, wherein the N channel transistor is a native type of transistor.

9. A detector according to claim 1, wherein the resistive divider bridge comprises a bridge resistor having means to short circuit the bridge resistor as a function of the output of the comparator, in order to introduce hysteresis in the desired threshold.

10. A detector of the level of supply voltage of an integrated circuit, comprising:
    a device for comparing having a first input receiving a first reference voltage and a second input receiving a second reference voltage, the two reference voltages varying differently as a function of a supply voltage to form curves of variation which intersect at a value of supply voltage which is located close to a desired threshold, the device for comparing further having an output which switches from a first state to a second state when the supply voltage crosses the threshold; a resistive divider bridge, supplied with the supply voltage, having an intermediate connector which supplies the first reference voltage; and
    a resistor series-connected with a first nonlinear element, the series-connection being supplied with the supply voltage, the point of junction of the resistor and the first non-linear element supplies the second reference voltage;
    wherein the resistive divider bridge comprises three series connected bridge resistors, the first bridge resistor is connected to the supply voltage, the third bridge resistor is connected to a ground and the second bridge resistor is connected between the first and third bridge resistors, the intermediate connector which provides the first reference voltage being connected between the second and third resistors.

11. A detector as in claim 10, wherein the non-linear element is a MOS transistor which has no channel doping.

12. A detector as in claim 10, wherein the second bridge resistor has short circuit means activated by the output of the comparator in order to lower the threshold voltage for which the comparator switches from the first state to the second state.

13. A detector as in claim 10, wherein the first nonlinear element has a first conduction threshold voltage, and wherein a second nonlinear element, connected across a third bridge resistor, has a second conduction threshold voltage smaller than the first conduction threshold voltage.

14. A detector as in claim 13, wherein the second non-linear element varies the first reference voltage as a function of temperature to compensate for the variations of the second reference voltage as a function of temperature, such that the curves of variation intersect at a value of supply voltage substantially independent of the temperature.

15. A detector as in claim 10, wherein respective values of the bridge resistors and the resistor which is series-connected with the first nonlinear element determine the value of the supply voltage for which the curves of variation intersect.

16. A detector as in claim 15, wherein an increased value of the resistor which is series-connected with the first nonlinear element and/or changes in size of the nonlinear element provide a detector which detects relatively lower voltages.

17. A detector of the level of a supply voltage of an integrated circuit comprising:
    a first arm to define a first reference voltage, wherein the first arm has a resistive divider bridge, of which an intermediate connector constitutes the first reference voltage;

a second arm to define a second reference voltage, the second arm comprising a resistor series-connected with a native P type MOS transistor, the point of junction of this resistor and this transistor constituting the second reference voltage, and wherein the second arm further comprises at least two native P type MOS transistors series-connected with one another;

wherein the first reference voltage and the second reference voltage vary differently as a function of the supply voltage and their curves of variation intersect for a value of the supply voltage close to a desired threshold;

a comparator receiving the two reference voltages; and wherein the first arm and the second arm are joined by a common conductor;

wherein at least one additional transistor having its gate connected to its drain is series-connected in each of the arms, between the supply voltage and the point that defines each of the reference voltages.

18. The detector of claim 17, wherein the first arm further comprises, between the base and the resistive divider bridge, one or more series-connected transistors, with their drain connected to their gate.

19. The detector of claim 17 comprising, between the common conductor constituting the base of the arms and a ground, several assemblies of transistors operable to establish different voltage drops between the ground and the common base of the two arms, so as to enable an adjustment of the voltage levels that the detector may detect.

20. The detector of claim 17 for application to the detection of high voltage levels wherein, between each of the points defining the reference voltages and the corresponding input of the comparator, there is provided a voltage level transposition stage comprising a transistor and a resistor series-connected with this transistor between a main low-voltage supply source and a ground, the first and second reference voltages being connected to the gate of this transistor, the respective input of the comparator being connected to the drain and to the resistor, the source of the transistor being connected to the ground.

\* \* \* \* \*